US008823220B2

(12) United States Patent
Yman et al.

(10) Patent No.: US 8,823,220 B2
(45) Date of Patent: *Sep. 2, 2014

(54) POSITIONING SYSTEM FOR POSITIONING A POSITIONING UNIT ALONG A LONGITUDINAL AXIS (71) Applicant: Mydata Automation AB, Taby (SE)

(72) Inventors: Niclas Yman, Ekero (SE); Robert Axelsson, Alvsjo (SE)

(73) Assignee: Mydata Automation AB, Taby (SE)

( * ) Notice: Subject to any disclaimer, the term of this patent is extended or adjusted under 35 U.S.C. 154(b) by 0 days.

This patent is subject to a terminal disclaimer.

(21) Appl. No.: 13/746,967

(22) Filed: Jan. 22, 2013

(65) Prior Publication Data

US 2013/0133187 A1 May 30, 2013

Related U.S. Application Data (63) Continuation of application No. 12/934,596, filed as application No. PCT/EP2009/002194 on Mar. 25, 2009, now Pat. No. 8,384,253.

(30) Foreign Application Priority Data

Mar. 25, 2008 (EP) .................................. 08153254

(51) Int. Cl.
*H02K 41/02* (2006.01)
*B05B 3/00* (2006.01)

(52) U.S. Cl.
USPC .................. 310/12.31; 310/12.02; 310/12.29; 239/722

(58) Field of Classification Search
CPC ........................................ H02K 41/00–41/065
USPC .......... 310/12.01, 12.02, 12.09, 12.27, 12.29, 310/12.31; 384/37–40, 54; 29/739; 239/722

See application file for complete search history.

(56) References Cited

U.S. PATENT DOCUMENTS 3,638,933 A 2/1972 Burnette et al.
4,704,792 A 11/1987 Itagaki et al.
(Continued)

FOREIGN PATENT DOCUMENTS

EP 1 194 028 A2 4/2002
JP 2005-64417 A 3/2005
(Continued)

OTHER PUBLICATIONS

WO2006013156 Derwent Abstract.
WO2006013156 Machine Translation, Jun. 19, 2012.

\* cited by examiner

*Primary Examiner* — John K Kim
*Assistant Examiner* — Thomas Truong
(74) *Attorney, Agent, or Firm* — Birch, Stewart, Kolasch & Birch, LLP (57) ABSTRACT A positioning system for positioning a positioning unit along a longitudinal axis includes: a linear guide arrangement for enabling a linearly guided motion parallel to the axis; a motor includes a moving motor member operatively connected to the linear guide arrangement and an elongated stationary motor member extending parallel to the axis; and a force transmission arrangement operatively connecting the moving motor member to the positioning unit, wherein the force transmission arrangement is arranged to provide a semi-rigid engagement between the positioning unit and the moving motor member, wherein the positioning unit and the moving motor member, respectively, are operatively connected to the linear guide arrangement by at least two guide engaging carriages, and wherein the positioning unit is attached to the guide engaging carriages by rigid or resilient positioning unit holders.

21 Claims, 6 Drawing Sheets

(56) References Cited

U.S. PATENT DOCUMENTS

| | | | | |
|---|---|---|---|---|
| 5,176,454 | A | * | 1/1993 | Schlereth .................. 384/45 |
| 6,754,551 | B1 | | 6/2004 | Zohar et al. |
| 7,922,613 | B2 | * | 4/2011 | Iida .............................. 474/140 |
| 8,384,253 | B2 | * | 2/2013 | Yman et al. ............... 310/12.31 |

2006/0049700 A1  3/2006  Moriyama

FOREIGN PATENT DOCUMENTS

| | | | |
|---|---|---|---|
| JP | 2008-067463 A | 3/2008 | |
| WO | WO 2006/013156 A1 | 2/2006 | |
| WO | WO 2006013156 A1 * | 2/2006 | ............. H02K 41/02 |

POSITIONING SYSTEM FOR POSITIONING A POSITIONING UNIT ALONG A LONGITUDINAL AXIS

CROSS-REFERENCE TO RELATED APPLICATIONS

This application is a Continuation of co-pending application Ser. No. 12/934,596 filed on Nov. 5, 2010 and for which priority is claimed under 35 U.S.C. §120, which is a National Stage of PCT/EP2009/002194 filed on Mar. 25, 2009, which claims priority under 35 U.S.C. §119(a) on Patent Application No. 08153254.1 filed in European Patent Office on Mar. 25, 2008, all of which are hereby expressly incorporated by reference into the present application.

FIELD OF THE INVENTION

The present invention relates to the field of circuit board manufacturing. More specifically, the invention relates to a positioning system for positioning a positioning unit along an elongated beam extending along an axis.

The invention also relates to a component mounting machine and a jetting machine comprising the positioning system mentioned above.

BACKGROUND OF THE INVENTION

Generally, within the field of manufacture and assembly of circuit boards, electronic components are mounted at a specific position on a substrate, such as a printed circuit board (PCB), by a pick-and-place or component mounting machine. The electronic components are picked from component feeder magazines and positioned on the substrate, for mechanical and/or electrical connection to the substrate, by a work head, often referred to as a pick-up head or component mounting head.

Prior to placing components on a substrate, the substrate has typically been provided with a viscous medium in the form of solder paste or glue at accurately determined locations on the substrate at which the component is to be placed and attached to the substrate. The application of the viscous medium is typically provided through screen printing, dispensing or jetting. Such dispensing or jetting is typically provided through a work head, also referred to as a dispensing or jetting head.

Servo controlled linear motions of the work head may be provided in the x and y directions, or along the x- and y-axes, i.e. in the general, horizontal plane of the circuit board, and in the z direction, or along the z-axis, i.e. vertically and generally perpendicular to the plane of the circuit board. For a work head used for jetting, there may be no need for providing motion of the work head in the z direction, which however is vital for a dispensing and a component mounting head.

The continued miniaturization of electronic circuits continuously increases the demand for more accurate placement of components and viscous medium for attaching the components. In order to meet such demands and to also increase manufacturing speed, more powerful linear motors may be provided and preferably arranged closer to the work head to reduce or eliminate influence of motion transmission. However, a drawback of providing more powerful linear motors closer to the work head, is that excess heat is generated closer to the actual positioning location. This may result in thermal expansions of parts of the positioning system, which will have a detrimental impact on positioning placement accuracy.

In a conventional linear motor arrangement having a stationary motor member and a therewith co-operating movable motor member, the driving movable motor member is provided with a number of iron cores having thereon wounded copper cable, i.e. an electric conductor. The oppositely arranged stationary motor member is provided with a number of magnetic elements arranged in a row along an axis. Preferably, these magnetic elements are angularly adjusted or tilted, thereby providing a more precise and continuous linear motion. During operation, electric current flows back and forth through the electric circuit coils surrounding the cores, thereby generating heat which may result in thermal expansion of the moving motor member. Thus, a linear motor arrangement used in a positioning system that is intended for precise and fast linear motion generates a large amount of heat. The heat causes the moving motor member to expand, possibly bend, which may result in a strained connection with built-in stress to a thereto connected positioning unit, which in turn may cause deformation of said positioning unit. Deformations of the positioning unit may also arise from thermal deviations of the positioning unit per se, if the positioning unit is subjected to large temperature variations.

Such a deformation may result in changes in the relative positions and orientations of elements comprised in or carried by the positioning unit, such as the nominal centre of the positioning unit, a detector for detecting the position along the positioning axis, a camera for detecting reference markings on a substrate or the like, and one or more work heads, e.g. component mounting heads and/or dispensing heads. Such a change in relative position, i.e. offset, between different elements carried by the positioning unit is undesired, since it is likely to have a detrimental effect on the accuracy in the positioning of the work heads, and thereby result in a decrease in production accuracy or, as a result of correcting for inaccuracies, production speed.

SUMMARY OF THE INVENTION

An object of the present invention is to provide an improved positioning system for positioning a positioning unit along an axis.

This and other objects are achieved by providing a positioning system having the features defined in the independent claim. Preferred embodiments are defined in the dependent claims.

According to a first aspect of the present invention, there is provided a positioning system for positioning a positioning unit along a longitudinal axis. The positioning system comprises a linear guide arrangement for enabling a linearly guided motion parallel to said axis, wherein the positioning unit is operatively connected to said guide arrangement. Furthermore, the positioning system comprises a motor, wherein the motor comprises a moving motor member operatively connected to said linear guide arrangement and an elongated stationary motor member extending parallel to said axis. The moving motor member is adapted to move along the stationary motor member for providing motion parallel to said axis. Moreover, the positioning system further comprises a force transmission arrangement which operatively connects said moving motor member to the positioning unit. The force transmission arrangement is arranged to provide an engagement between said positioning unit and said moving motor member. The engagement is rigid in a direction parallel to said axis for instantaneous transmission of a linear force, and is resilient in directions other than said direction parallel to said axis, whereby transmission to the positioning unit of forces arising from thermal expansion of the motor is reduced or eliminated.

According to a second aspect of the present invention, there is provided a component mounting machine which is arranged for mounting electronic components onto substrates, the machine having a positioning system according to the preceding paragraph.

According to a third aspect of the present invention, there is provided a jetting machine for jet dispensing of individual drops of viscous medium onto substrates, the machine having a positioning system according to said preceding paragraph.

According to a fourth aspect of the present invention, there is provided a dispensing machine for dispensing of viscous medium onto substrates, the machine having a positioning system according to said preceding paragraph.

Thus, the present invention is based on the insight of using a force transmission arrangement operatively connecting a positioning unit to a motor for linear motion along a linear motion direction, wherein the force transmission arrangement provides a semi-rigid engagement between the moving motor member and the positioning unit that is rigid in the direction parallel with said axis, i.e. in a linear motion direction, and wherein the engagement is resilient in all other directions. Thereby, the linear driving force of the moving motor member can be directly transmitted to the positioning unit during operation of the positioning system. Also, any deformation of the moving motor member as a result of thermal expansion is compensated for by allowing the relative spatial distance or space between the moving motor member and the positioning unit to vary, whereby the orientation of the positioning unit and the shape thereof is unaffected by the thermal deformations of the moving motor member. As a consequence, the above mentioned detrimental effects resulting from changes in the relative position of separate elements carried by the positioning unit are eliminated, enabling a high operational accuracy to be maintained during the production process.

It should be noted that the term "semi-rigid" as used herein is intended to refer to an element that is rigid to some degree or in some parts. Moreover, it should be noted that the term "resilient" as used herein is intended to refer to an element that is capable of resuming its shape after being subjected to shape deforming forces. Consequently, the semi-rigid engagement of the force transmission arrangement is thereby partially rigid, i.e. the engagement is rigid in the linear motion direction. Furthermore, during the operation of the positioning system, the engagement is affected by thermally induced forces which need to be taken care of, and which otherwise would compromise the intended function of the force transmission arrangement. Hence, the semi-rigid engagement is thereby resilient in directions other than the rigid direction for springily absorbing such forces. When the positioning system then enters a state of rest, said forces fade away concurrently with the cooling of the system, which thereby restores the semi-rigid engagement to its initial shape and form.

Also, it should be noted that the term "positioning unit" as used herein is intended to refer to an element which is to be put in certain position. In the embodiments described and shown below, the term positioning unit refers to a unit for positioning a pick-up head or placement head intended for placement of components on substrates, i.e. in a component mounting machine. However, a positioning unit may also be arranged for positioning a jet dispensing head in a jet dispensing machine, a dispensing head in a machine for conventional dispensing, or in some embodiments, a unit adapted to position, in turn, another positioning unit.

A significant advantage of the solution according to the invention is that the positioning unit may be accurately positioned and at a high speed along an axis irrespective of the thermally induced deformations of the moving motor member which is intended for driving the positioning unit along a linear guide arrangement, i.e. along an axis. In all high-speed and precise positioning systems, the driving member of the motor, i.e. the moving motor member, generates heat which affects its position relative to the linear guide arrangement and, in turn, affects the positioning unit via the intermediate force transmission connection, e.g. offsets the positioning unit relative to the guide arrangement. In the positioning system of the invention, due to the combined rigid and resilient engagement feature of the force transmission arrangement, the heat induced offsetting forces are reduced, and in some cases even eliminated, ensuring an accurate and fast positioning of a positioning unit.

During operation of the positioning system, the positioning unit is essentially fixed with respect to said axis in directions orthogonal to said axis when moving back and forth along the axis. Thus, the spatial motion of the positioning unit is limited to a motion along an axis, thereby ensuring an accurate positioning of the positioning unit.

According to an embodiment of the invention, the system comprises an elongated beam extending along the axis and the linear guide arrangement is attached to said beam such that the linear guide arrangement can provide a linear motion along said axis, i.e. in a linear motion direction. The beam, preferably made of a rigid material, provides rigidity to the positioning system, thereby enabling even further a linear motion accuracy of the positioning unit.

In a further embodiment of the invention, the linear guide arrangement comprises at least two elongated guide portions, which are arranged in parallel with the axis. Thus, the positioning unit operatively connects the guide arrangement by means of at least two points of engagement. As a result, the forces that operatively connects the positioning unit to the guide arrangement are distributed, thereby enabling a smooth linear motion and a reduction in the stress, said stress being due to inertia arising during the back and forth motion of the positioning unit. Such elongated guide portions may, for example, be a pair of guide rails arranged in parallel. The guide portions may also be attached to the beam, and may in some embodiments include an upper and a lower elongated linear guide portion parallel to the axis. However, in some embodiments, the linear guide arrangement may comprise a single linear guide.

According to further embodiments of the invention, the positioning unit and moving motor member, respectively, are operatively connected to the linear guide arrangement by means of at least two guide engaging carriages. Such carriages spatially locks the moving motor member and the positioning unit, respectively, to the guide arrangement, for example the at least two elongated guide portions, in a manner such that only a linear motion along the guide arrangement is allowed. In case of an upper an lower elongated linear guide portion, the moving motor member and positioning unit are suspended by means of at least an upper and a lower guide engaging carriage from said upper and lower guide portions, respectively.

In a further embodiment, the positioning unit and the moving motor member share at least one common guide engaging carriage. In other words, the positioning unit and moving motor member are both connected to a common carriage. In an arrangement where the positioning unit and moving motor member share one common guide engaging carriage and each is connected to at least one further carriage, respectively, the positioning unit may be moved partly independently relative to the moving motor member in the sense that the positioning unit is unaffected by a thermally induced expansion of the moving motor member. Thereby, such an arrangement enables a resulting precise linear motion.

According to another embodiment the positioning unit is attached to the guide engaging carriages by means of resilient positioning unit holders, whereby transmission to the positioning unit via said carriages of forces arising from thermal expansion of the motor is reduced or eliminated. Said resilient positioning unit holders may have various shapes to provide the resilient feature or characteristic of the holders. However, the positioning unit holders provide an essentially rigid fixation with respect to said axis in directions orthogonal to said axis when moving back and forth along the axis. The positioning unit holders are resilient in a direction parallel to the axis, i.e. the moving direction. Specifically, in a further embodiment of the invention, having at least two common carriages shared by the moving motor member and positioning unit, wherein both carriages are arranged on a common linear guide portion, the positioning unit holders resiliently reduces and absorbs stress related forces arising from, for example, thermally induced expansion of the moving motor member. Stress related forces in the positioning unit are thereby reduced or eliminated, ensuring the dimensional integrity of the positioning unit.

In a further embodiment of the positioning system according to the invention, the positioning unit and the moving motor member share at least two upper and two lower guide engaging carriages. Furthermore, the moving motor member is fixedly attached to said two upper carriages and attached to the lower carriages by means of resilient moving motor holders, or vice versa, and the positioning unit is attached to guide engaging carriages by means of resilient positioning unit holders. Preferably, the resilient moving motor holders provide a resilient feature in directions orthogonal to said axis. Moreover, and as mentioned above, the resilient positioning unit holders attached to the upper carriages are preferably resilient in the moving direction parallel to the axis. The resilient positioning unit holders attached to the lower carriages are essentially resilient in all directions.

In yet another embodiment of the positioning system according to the invention, the positioning unit and the moving motor member have separate guide engaging carriages. Furthermore, the moving motor member is fixedly attached to at least one upper carriage and attached to at least one lower carriage by means of a resilient moving motor holder, and the positioning unit is fixedly attached to further upper and lower carriages. The, need for resilient holders for attaching the positioning unit to the carriages may be eliminated due to the provision of separate carriages. However, the force transmission arrangement still resiliently absorbs any undesirable thermally induced forces from the moving motor member.

According to another embodiment of the positioning system according to the invention, the moving motor member is arranged between the stationary motor member and the positioning unit. Preferably, the moving motor member is centered relative to the positioning unit in the direction parallel with the axis. Thus, the positioning unit and the moving motor member share a common longitudinal space portion of the linear guide arrangement. The elongated space of beam is thus used in an space efficient manner, thereby ensuring that the entire length of the beam may be used for positioning the positioning unit.

In another embodiment of the positioning system according to the invention, the system further comprises a cooling arrangement for conduction of heat away from the moving motor member for limiting heat-induced deformations or expansions of the motor, as well as preventing possible overheating. Moreover, in some embodiments, the cooling arrangement is mounted to the moving motor member such that the moving motor member operatively connects the linear guide arrangement via the cooling arrangement. Thus, the moving motor holders mentioned above connects, in this embodiment, the cooling arrangement to the guiding arrangement. These holders may constitute part of the cooling arrangement, or may alternatively, as above, be separate elements. The cooling arrangement is formed such that a heat transferring effect is achieved, preferably by the use of flange means. Alternatively, the arrangement comprises a flow generating arrangement, such as a suction arrangement, for removing heated air away from the moving motor member and cooling arrangement.

Thus, the flow of air is preferably provided by a flow generating arrangement, such as a separate suction or blow generating arrangement. It should however be noted that use can also be made of the source of pressurized air conventionally provided in component mounting and dispensing machines.

The provision of a cooling arrangement for conducting heat away from the moving motor member also prevents heat transformation from the moving motor member to the positioning unit. Thereby, thermally induced deformations of portions of the positioning unit due to the heat generated by of the moving motor member is prevented. Furthermore, in embodiments where the cooling arrangement is provided between the moving motor member and the positioning unit, the cooling arrangement is as a consequence also provided between the beam and the positioning unit, and, thereby, prevents the transformation of heat from the beam to the positioning unit. Thus, the provision of a cooling arrangement between the moving motor member and the positioning unit interrupts transfer of heat from the motor, as well as from the beam, whereby heat induced deformations of the positioning unit is prevented.

The holders mentioned above may be formed in various manner, e.g. arranged separately, together or as a combination thereof. Preferably, the holders are integrally formed, but are formed such that the individual mechanical characteristics, e.g. the rigid or resilient features, are maintained between the respective parts of the system. Integral holders that combine the moving motor holder and the positioning unit holder enable an easy manufacture thereof.

As envisaged by the person skilled in the art, even though the description refers to positioning systems within the field of manufacture and assembly of circuit boards, such as for component mounting, jetting and dispensing machines, the invention disclosed herein is also applicable to other positioning systems. In particular, the present invention is essentially applicable to any positioning system requiring high operational frequency, i.e. the frequency of the back and forth motion of the positioning unit, at high accuracy where elements of the positioning system are subjected to thermally induced positional and shape variations, e.g. due to heat generated by linear motors.

Furthermore, where in the summary of the invention and the following description of preferred embodiments, reference is made to a component mounting machine and corresponding work head in the form of a component mounting head, or pick-up head, the component mounting machine may be substituted for a jet dispensing or conventional dispensing machine, and the corresponding work head for a jetting head or a dispensing head.

Moreover, the positioning of a work head in the x- and y-directions in relation to a substrate could for instance be provided by moving the work head along the x- and y-axes, or by moving the work head along the x-axis and the substrate along the y-axis. A positioning system where the relative movement between the substrate and the work head is provided by moving the work head in both the x- and the y-direction is often labeled a gantry system, while a system where the work head is moved along the x-axis and the substrate is moved along a perpendicular axis is labeled a split-axis system. It should be noted that the present invention is not limited to any particular positioning system. On the contrary, the present invention is applicable to positioning systems of any suitable type, including the gantry and split-axis type of positioning systems.

The features that characterize the invention, both as to organization and to method of operation, together with further objects and advantages thereof, will be better understood from the following description used in conjunction with the accompanying drawings. It is to be expressly understood that the drawings is for the purpose of illustration and description and is not intended as a definition of the limits of the invention. These and other objects attained, and advantages offered, by the present invention will become more fully apparent as the description that now follows is read in conjunction with the accompanying drawings.

BRIEF DESCRIPTION OF THE DRAWINGS

Preferred embodiments of the invention will now be described in greater detail with reference to the accompanying drawings, in which

FIG. 4b is another plan view of the cooling arrangement in FIG. 4a;

DESCRIPTION OF PREFERRED EMBODIMENTS

Figure 7:
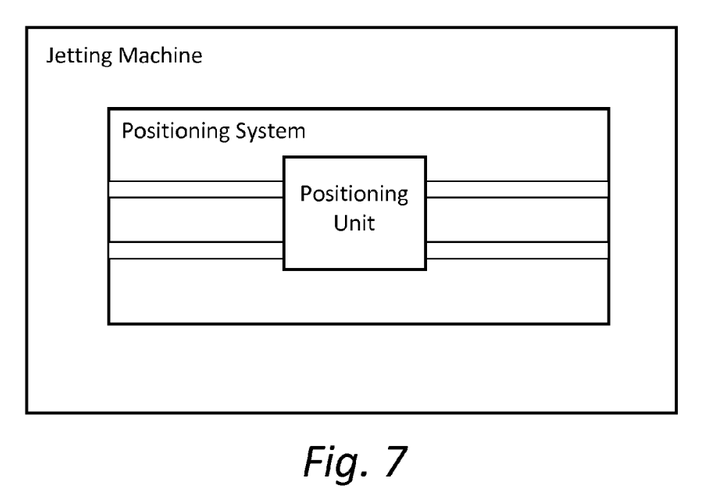
FIG. 7 is a schematic view of a jetting machine comprising a positioning system according to an embodiment of the present invention.
Figure 8:
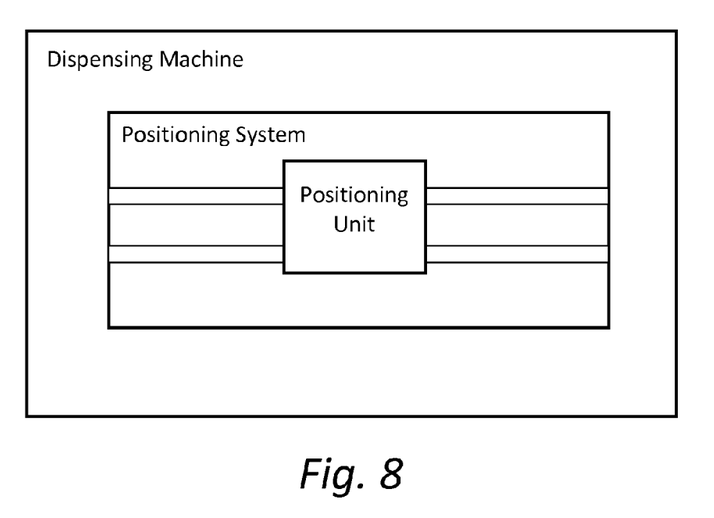
FIG. 8 is a schematic view of a dispensing machine comprising a positioning system according to an embodiment of the present invention.

The present invention will now be further described in connection with the accompanying drawings. It should be noted, that even though a positioning system in a component mounting machine will be described and illustrated, the present invention is also applicable to positioning systems in other applications. Such applications include, but are not limited to, jet dispensing and conventional dispensing machines. Thus, the machine referred to in the following could be a component mounting machine, a jetting machine (as shown in FIG. 7), a dispensing machine (as shown in FIG. 8), a combination thereof, or another machine with high demands for accurate positioning.

Figure 1:
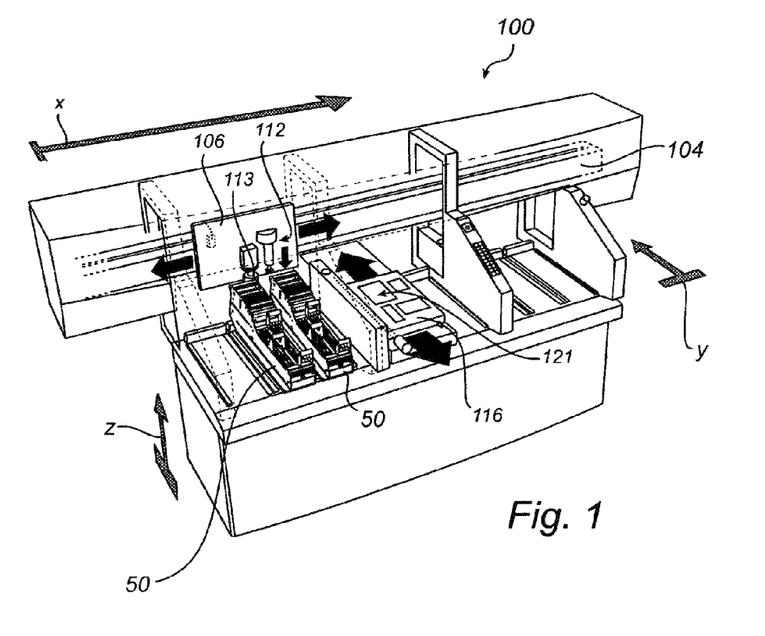
FIG. 1 is a schematic perspective view of a component mounting machine comprising a positioning system according to embodiments of the present invention.

FIG. 1 schematically shows a component mounting or pick and place machine 100 for mounting electronic components on printed circuit boards 121. The positioning system of the component mounting machine is of a split-axis type, in which the machine comprises a first axis, indicated by the arrow "x", along which a positioning unit 106 is moved, carrying a work or mounting head 112 and a sensing device 113, and a second axis, indicated by the arrow "y", along which a wagon 116 is moved, providing a working surface or working area, and carrying circuit boards 121 or other suitable substrates onto which components are to be placed. The x- and y-axes are essentially orthogonal. Thus, the machine 100 comprises a positioning system for positioning the work head 112 at a desired location in relation to the circuit boards 121.

Furthermore, the positioning system comprises linear motors (not shown) for movement of the positioning unit 106 and the wagon or board carrier 116. The machine 100 also comprises a control unit (not shown), e.g. a micro processor, for controlling the linear motors. The work head 112 is used for picking components from component feeder magazines 50 and placing them onto the circuit boards 121. The sensing device 113 is typically, as well as in the illustrated embodiments, in the form of a camera 113, which is connected to an image processing system, and used e.g. for calibrating the positioning system and verifying the position and orientation of the circuit boards.

A circuit board design determines the layout of the circuits on the circuit board 121, and the desired positions for different components. These positions are entered into the pick and place machine and converted into nominal or machine coordinates. Circuit boards 121, which have been printed according to the determined layout, and which are provided with solder paste, flux, or adhesive at the respective desired positions for the electronic components, are provided on the wagon 116. The control system of the machine controls the positioning system such that the work head 112 picks the correct type of component from a component supply or magazine 50 of component feeders, and positions the component at the desired location on the circuit board 121 according to the determined layout. The exact held position of the picked component when held by the mount head 112 is determined by a separate camera (not shown), and the machine compensates for any position or orientation offset when picking the component before placing the component on the board.

Figure 2:
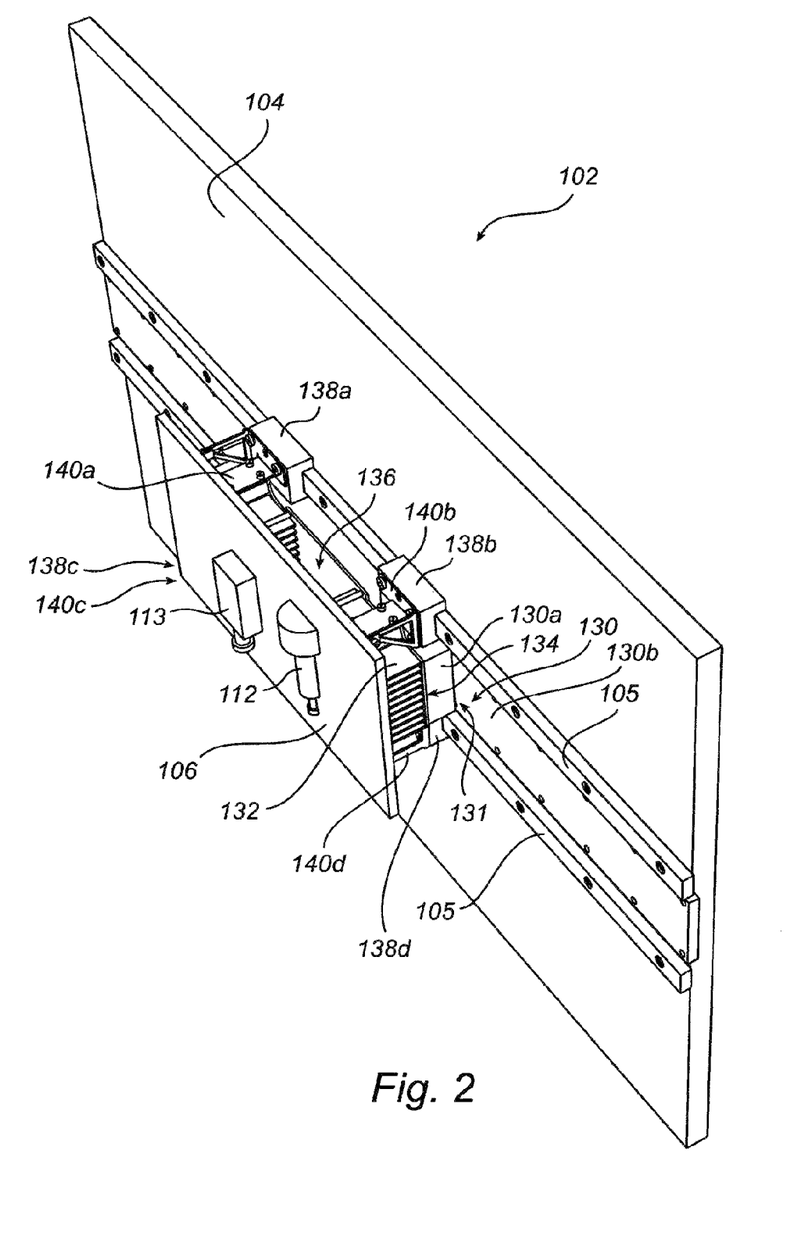
FIG. 2 is a plan view of a positioning system according to an embodiment of the invention.

Referring to FIG. 2, a positioning system 102 is shown, wherein the positioning unit 106 is movably suspended from a linear guide arrangement or linear guides 105, extending along an elongated beam 104. As mentioned above, a linear motor 130 provide movement or motion of the positioning unit. The linear motor 130 constitutes a movable member or moving motor member 130a and a stationary member or stationary motor member 130b, wherein an intermediate spacing 131 (cf. FIG. 3) separates the movable member 130a from the stationary member 130b. As is understood, other conventional linear motors may be used, other than the one described herein. Furthermore, a cooling arrangement 132 for transportation of heat generated in the movable member 130a, is connected to the movable linear motor member 130a by means of a heat conducting interlayer (not shown), e.g. an adhesive. Alternatively, the cooling arrangement 132 may also be directly secured to the movable member 130a, with an intermediate layer of heat conducting material, by means of fasteners, such as screws, bolts or the like. The cooling arrangement 132 is provided with a number of parallel flanges 134, which are separated for allowing air to flow in between.

In a centre portion of the cooling arrangement 132, the flanges 134 are left out creating a flow output 136 for discharge of heated air, i.e. the flanges 134 transfer the heat to the in between flowing air.

The flow of air is provided by a flow generating arrangement, such as a suction or blow generating arrangement. In the embodiments referred to below, the flow generating arrangement is exemplified by a suction generating arrangement. However, the invention is by no means restricted to any particular type of flow generating arrangement.

Figure 4A:
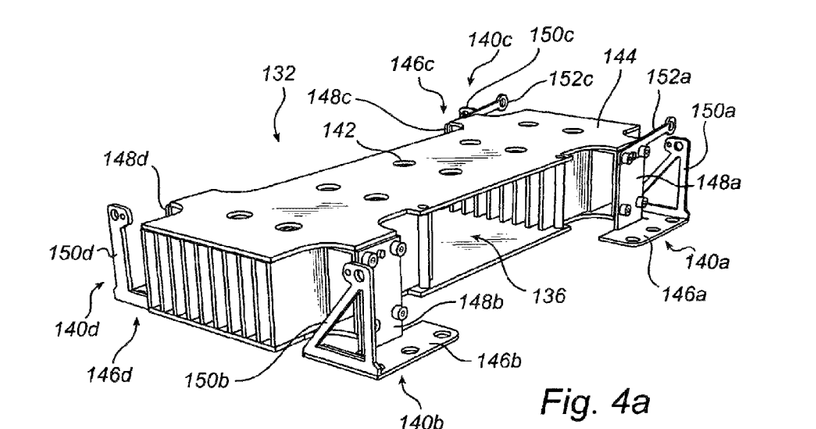
FIG. 4a is a plan view of a cooling arrangement according to an embodiment of the invention.

The cooling arrangement 132 is basically an elongated hollow flat box provided with flanges 132 at the elongated ends and has one opening 136 for letting out a flow of air (cf. FIG. 4a). Preferably, in the wall opposite to wall provided with the output 136 is intact, i.e. no holes are provided. Furthermore, the cooling arrangement is preferably made of aluminum.

Although not shown in FIG. 2, the flow output 136 is preferably provided with a suction arrangement. For example, at least one suction device (not shown), e.g. a fan, is attached to edges surrounding the flow output 136, thereby covering the opening of the flow output 136 and forcing the heated air flow flowing in between the flanges from both ends of the cooling arrangement 132 through the output 136 and the suction device to the outside. Thus, two air flows are forced into the longitudinal opposite ends, thereby flowing towards each other against the output 136, and cools the cooling arrangement 132 by flowing in between the flanges, which, in turn, leads the heat to the thereby passing air flow. Thereafter, the heated air flow is forced away from the machine 100 by means of the suction arrangement, thereby preventing heat induced deformation of the position unit 106, or portions thereof, and preventing overheating of the movable linear motor member 130a.

Another example embodiment would be to provide the cooling arrangement with two opposite flow outputs, e.g. arrange a second flow output opposite the first output 136 and, hence, arrange a second suction arrangement at the second output.

Furthermore, the positioning unit 106 is movably connected to linear guides 105 by means of four engagement elements or guide engaging carriages 138a-d for movable engagement with the guides 105. More specifically, the positioning unit 106 and the moving motor member are secured to the four engaging elements 138a-d by means of four holder elements 140a-c (cf. FIGS. 4a and 4b). These holder elements are designed to compensate for heat induced deformations of the movable member 130a of the linear motor 130. In other words, heat causes the movable member 130a and the thereto connected cooling arrangement 132 to deform, such as prolongation and bending, thereby effecting the relative position of the engagement elements 138a-d. Consequently, the holder elements 140a-d, which will be explained in more detail below, are arranged to take up the heat induced stress in the suspension arrangement, thereby enabling a stress-free operation of the positioning unit 106.

Figure 3:
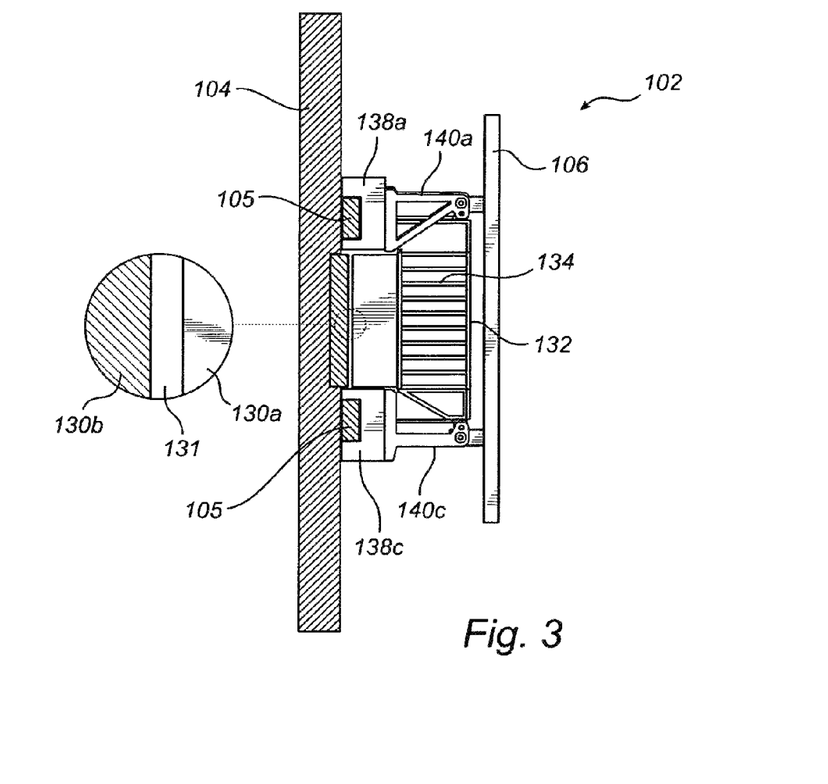
FIG. 3 is a side view of the positioning system of FIG. 2.

FIG. 3 is a side view of the positioning system of FIG. 2, showing the left side of the positioning unit 106 connected to the linear guides 105, which are attached to the elongated beam 104. The engagement elements 138a and 138c are movably attached to the linear guides 105, such that the positioning unit which is connected to the elements 138a-d can be moved in a guided manner along the linear guides 105. As mentioned above, the positioning unit 106 is connected to the engagement elements 138a-d by means of the resilient holder elements 140a-d (138b, 138d, 140b and 140d not shown). Also, the cooling arrangement 132 is secured to the engagement elements 138a-d. The cooling arrangement 132 holds the moving member 130a of the linear motor. As can be seen in the enlarged portion, the movable member 130a is separated from the stationary member 130b by a spacing, which is sufficient to avoid frictional contact and, at the same time, enable a linear motor effect. The flanges 134 defines air flow conduits which leads to the flow output 136 at the centre of the arrangement 132, and, as mentioned above, the flow is forced away by means of a suction arrangement (not shown).

Figure 4B:
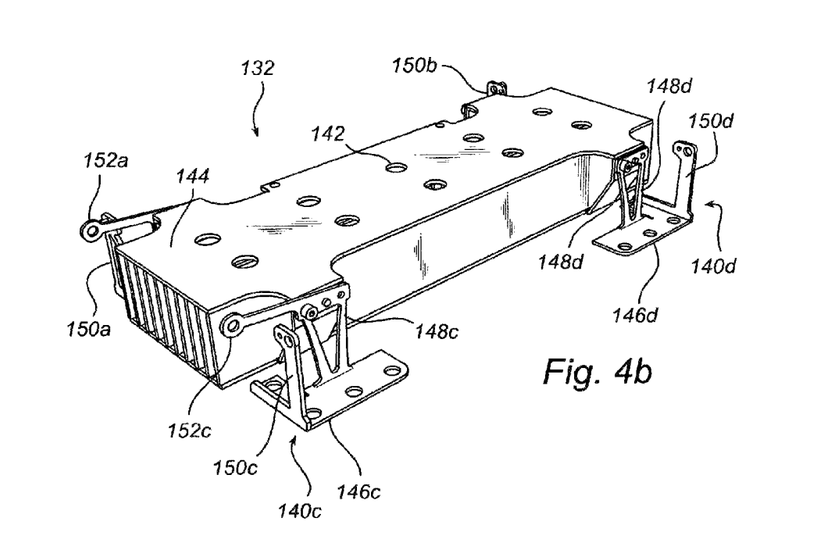

Referring to FIGS. 4a and 4b, there two plan views of the cooling arrangement 132 having the holder elements 140a-d thereto connected are shown. In addition to a suction arrangement (not shown) provided at the flow output 136, the arrangement 132 is provided with a number of holes 142 in a wall 144 facing the positioning unit 106 (not shown). Thereby, an additional cooling effect may be achieved. The holder elements 140a-d comprises a first portion 146a-d adapted to be fixedly secured to the engagement elements 128a-d (not shown), a second portion or moving motor holder 148a-d adapted to secure the moving motor member 130a (not shown) to the guide elements 138a-d (not shown), and a third portion or positioning unit holder 150a-d adapted to secure the positioning unit 106 to the guide elements. The moving motor holders 148a-b rigidly connects the cooling arrangement to the guide engaging carriages 138a-b (not shown). The configuration of the portions 150a and 150b are different from that of the portions 150c and 150d. Upper portions 150a-b have a triangular mechanical structure, such that rigidity in the yz-plane (cf. FIG. 1) is achieved, whereas the portions 150c-d have a simpler straight mechanical structure with a rigidity in the y-direction Regarding the x-directional rigidity, all portions 150a-d are resilient in the x-direction, such that, for example, a prolongation of the movable member 130a and the thereto connected cooling arrangement 132 can be compensated for, since the prolongation, in turn, offsets the engagement elements 138a-d further out. Consequently, a force transmission arrangement is provided to transmit the x-directional or linear force from the motor member 130a of the motor 130 to the positional unit 106. In FIGS. 4a and 4b, the holders 140a and 140c are provided with a fourth portion 152a and 152c having the shape of flat pin, extending essentially in the longitudinal direction. This fourth portion 152a and 152c constitutes such a force transmission arrangement, which provides a rigid engagement between said positioning unit 106 and motor 130, i.e. the movable motor portion 130a, in the direction parallel with beam extending axis, i.e. along said moving direction for instantaneous transmission of a linear force. However, although the force transmission arrangement according to the embodiment in FIGS. 4a and 4b. constitutes the two pins 152a and 152c, which forms part of the holder elements 140a and 140c, respectively, other arrangement may be used.

Figure 5:
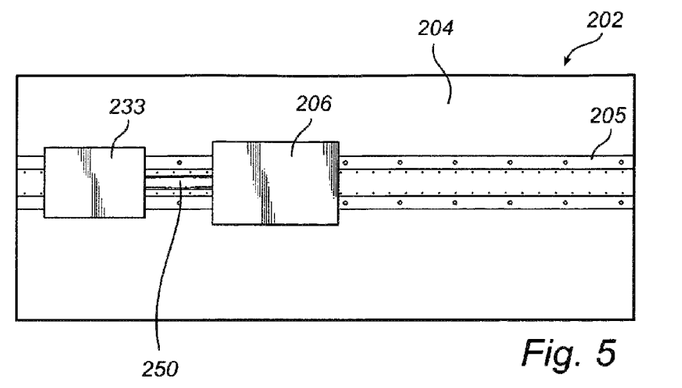
FIG. 5 is a front view of another embodiment of the invention.

An example of an alternative arrangement would be a single pin arranged at a center portion of the wall 144. Furthermore, another example embodiment would be to incorporate the force transmission arrangement with the cooling arrangement, e.g. arrange some sort of protruding tongue from the wall facing the positioning unit 106. FIG. 5. is a front view of an example embodiment of a positioning system 202. A positioning unit 206 and a driving member 233 containing a movable member of a linear motor (not shown), and optionally a cooling arrangement (cf. FIG. 2), are each movably suspended with linear guides 205 which extends along an elongated beam 204. As in the embodiment mentioned above, the linear motor (not shown) provide a linear movement of the positioning unit. A force transmission arrangement 250 operatively connects the positioning unit 206 to the driving member 233, i.e. linear motor, such that a rigid engagement is provided between the positioning unit and the driving member along the moving direction for instantaneous transmission of a linear force.

Figure 6:
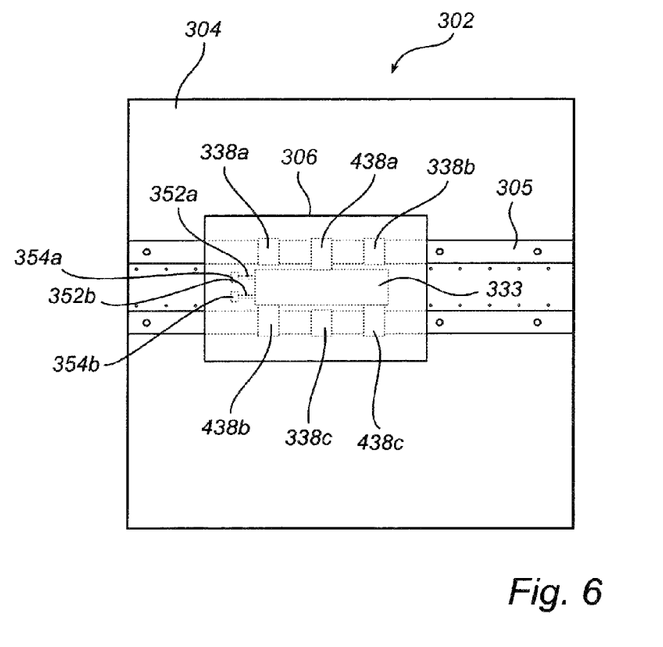
FIG. 6 is a front view of yet another embodiment of the invention.

Referring to FIG. 6, there a front view of yet another example embodiment of the invention is shown. As in the embodiments of FIGS. 1-5, a positioning system 302 is shown wherein a positioning unit 306 and a driving member 333 (cf. FIG. 5) containing a movable member of a linear motor (not shown), preferably with a cooling arrangement attached thereto, are each movably suspended with a linear guide arrangement 305 which extends along an elongated beam 304. As mentioned above, the linear motor provide a linear movement of the positioning unit. The force transmission arrangement constitutes, in the embodiment of FIG. 6, a pair of elongated pins 352a and 352b which connects the driving member 333, i.e. linear motor, to a pair of attachment portions 354a and 354b of the positioning unit 306. These pins 352a and 352b provides a rigid engagement between the positioning unit and the driving member along a direction parallel to the moving direction for instantaneous transmission of a linear force. Furthermore, the pins are also resiliently flexible in directions other than the direction parallel to the moving direction, i.e. the engagement is rigid in one direction but otherwise resilient such that forces due to, for example, thermal expansions can be received and absorbed in the pins, thereby leaving the positioning unit 306 unaffected. Consequently, the positioning unit may be accurately positioned.

Moreover, in FIG. 6, the positioning unit 306 is movably attached and suspended to the linear guide arrangement 305 by means of two upper engagement elements 338a-b and a lower element 338c engaging the upper and lower guide of the arrangement 305, respectively. In between the two upper positioning guide engaging carriages 338a and 338b, an upper guide engaging element 438a suspends the driving member 333 to the upper guide of the linear guide arrangement 305. On either side of the lower element 338c, the driving member is movably attached to the arrangement 305 by means of two lower guide engaging 438b and 438c. This oppositely and alternatively arranged guide engaging elements 338a-c and 438a-c provides a compact construction, in the sense that the positioning unit 306 and driving member 333 shares a common linear portion of the linear guide arrangement 305. This space saving effect, due to the alternatively arranged engagement elements, provides for a more efficient use of the guide arrangement, such that the entire length thereof can be used. As is understood by the person skilled in the art, the engagement elements 338a-c and 438a-c may also be inversely arranged, whereby the movable member 333 is attached to the linear guide arrangement 305 by means of two upper and one lower engagement elements, whereas the positioning unit engages by means of one upper and two lower engagement elements.

Regarding the engagement elements mentioned herein, these elements in co-operation with the linear guide arrangement provides a linear motion by means of, for example, ball bearings, roller bearings and/or linear air bearings.

Although an exemplary embodiment of the present invention has been shown and described, it will be apparent to those having ordinary skill in the art that a number of changes, modifications, or alterations to the inventions as described herein may be made. Thus, it is to be understood that the above description of the invention and the accompanying drawings is to be regarded as a non-limiting example thereof and that the scope of protection is defined by the appended patent claims.

What is claimed is:

1. A positioning system for positioning a positioning unit along a longitudinal axis, the positioning system comprising:
    a linear guide arrangement for enabling a linearly guided motion parallel to said axis, the positioning unit being operatively connected to said guide arrangement,
    a motor comprising a moving motor member operatively connected to said linear guide arrangement and an elongated stationary motor member extending parallel to said axis, the moving motor member being adapted to move along the stationary motor member for providing motion parallel to said axis; and
    a force transmission arrangement operatively connecting said moving motor member to the positioning unit, wherein the force transmission arrangement is arranged to provide a semi-rigid engagement between said positioning unit and said moving motor member, said semi-rigid engagement being rigid in a direction parallel to said axis for instantaneous transmission of a linear force, and being resilient in directions other than said direction parallel to said axis, whereby transmission to the positioning unit of forces arising from thermal expansion of the motor is reduced or eliminated,
    wherein the positioning unit and the moving motor member, respectively, are operatively connected to the linear guide arrangement by at least two guide engaging carriages, and
    wherein the positioning unit is attached to the guide engaging carriages by rigid or resilient positioning unit holders.

2. The positioning system according to claim 1, wherein said positioning unit is essentially fixed with respect to said axis in directions orthogonal to said axis.

3. The positioning system according to claim 2, wherein the guide arrangement comprises at least two elongated guide portions parallel to said axis.

4. The positioning system according to claim 2, wherein the linear guide arrangement comprises at least an upper and a lower elongated guide portion parallel to said axis, and the moving motor member and positioning unit are suspended by at least an upper and a lower guide engaging carriage from said upper and lower guide portions, respectively.

5. The positioning system according to claim 1, wherein the guide arrangement comprises at least two elongated guide portions parallel to said axis.

6. The positioning system according to claim 5, wherein the linear guide arrangement comprises at least an upper and a lower elongated guide portion parallel to said axis, and the moving motor member and positioning unit are suspended by at least an upper and a lower guide engaging carriage from said upper and lower guide portions, respectively.

7. The positioning system according to claim 1, wherein the linear guide arrangement comprises at least an upper and a lower elongated guide portion parallel to said axis, and the moving motor member and positioning unit are suspended by at least an upper and a lower guide engaging carriage from said upper and lower guide portions, respectively.

8. The positioning system according to claim 1, wherein the positioning unit and the moving motor member share at least one common guide engaging carriage.

9. The positioning system according to claim 1, wherein the positioning unit holders are resilient positioning unit holders, and transmission to the positioning unit via said carriages of forces arising from thermal expansion of the motor is reduced or eliminated.

10. The positioning system according to claim 1, wherein the positioning unit and the moving motor member share at least two upper and two lower guide engaging carriages, and
wherein the moving motor member is fixedly attached to said two upper guide engaging carriages and attached to the lower guide engaging carriages by resilient moving motor holders, or vice versa, and the positioning unit is attached to said two upper and two lower guide engaging carriages by the rigid or resilient positioning unit holders.

11. The positioning system according to claim 1, wherein the moving motor member is arranged between the stationary motor member and the positioning unit, whereby the positioning unit and the moving motor member share a common longitudinal space portion of the linear guide arrangement.

12. The positioning system according to claim 1, further comprising a cooling arrangement for conduction of heat away from the moving motor member wherein the cooling arrangement is mounted to the moving motor member, and wherein the moving motor member is operatively connected the linear guide arrangement via the cooling arrangement.

13. A component mounting machine arranged for mounting electronic components onto substrates, comprising:
a positioning system, the positioning system comprising:
a linear guide arrangement for enabling a linearly guided motion parallel to said axis, the positioning unit being operatively connected to said guide arrangement,
a motor comprising a moving motor member operatively connected to said linear guide arrangement and an elongated stationary motor member extending parallel to said axis, the moving motor member being adapted to move along the stationary motor member for providing motion parallel to said axis; and
a force transmission arrangement operatively connecting said moving motor member to the positioning unit, wherein the force transmission arrangement is arranged to provide a semi-rigid engagement between said positioning unit and said moving motor member, said semi-rigid engagement being rigid in a direction parallel to said axis for instantaneous transmission of a linear force, and being resilient in directions other than said direction parallel to said axis, whereby transmission to the positioning unit of forces arising from thermal expansion of the motor is reduced or eliminated,
wherein the positioning unit and the moving motor member, respectively, are operatively connected to the linear guide arrangement by at least two guide engaging carriages, and
wherein the positioning unit is attached to the guide engaging carriages by rigid or resilient positioning unit holders.

14. The component mounting machine according to claim 13, wherein the positioning unit holders are resilient positioning unit holders, and transmission to the positioning unit via said carriages of forces arising from thermal expansion of the motor is reduced or eliminated.

15. The component mounting machine according to claim 13, wherein the positioning unit and the moving motor member share at least two upper and two lower guide engaging carriages, and
wherein the moving motor member is fixedly attached to said two upper guide engaging carriages and attached to the lower guide engaging carriages by resilient moving motor holders, or vice versa, and the positioning unit is attached to said two upper and two lower guide engaging carriages by the rigid or resilient positioning unit holders.

16. A jetting machine for jet dispensing of individual drops of viscous medium onto substrates, comprising:
a positioning system for positioning a positioning unit along a longitudinal axis, the positioning system comprising:
a linear guide arrangement for enabling a linearly guided motion parallel to said axis, the positioning unit being operatively connected to said guide arrangement,
a motor comprising a moving motor member operatively connected to said linear guide arrangement and an elongated stationary motor member extending parallel to said axis, the moving motor member being adapted to move along the stationary motor member for providing motion parallel to said axis; and
a force transmission arrangement operatively connecting said moving motor member to the positioning unit, wherein the force transmission arrangement is arranged to provide a semi-rigid engagement between said positioning unit and said moving motor member, said semi-rigid engagement being rigid in a direction parallel to said axis for instantaneous transmission of a linear force, and being resilient in directions other than said direction parallel to said axis, whereby transmission to the positioning unit of forces arising from thermal expansion of the motor is reduced or eliminated,
wherein the positioning unit and the moving motor member, respectively, are operatively connected to the linear guide arrangement by at least two guide engaging carriages, and
wherein the positioning unit is attached to the guide engaging carriages by rigid or resilient positioning unit holders.

17. The jetting machine according to claim 16, wherein the positioning unit holders are resilient positioning unit holders, and transmission to the positioning unit via said carriages of forces arising from thermal expansion of the motor is reduced or eliminated.

18. The jetting machine according to claim 16, wherein the positioning unit and the moving motor member share at least two upper and two lower guide engaging carriages, and
wherein the moving motor member is fixedly attached to said two upper guide engaging carriages and attached to the lower guide engaging carriages by resilient moving motor holders, or vice versa, and the positioning unit is attached to said two upper and two lower guide engaging carriages by the rigid or resilient positioning unit holders.

19. A dispensing machine for dispensing of viscous medium onto substrates, comprising:
a positioning system for positioning a positioning unit along a longitudinal axis, the positioning system comprising:
a linear guide arrangement for enabling a linearly guided motion parallel to said axis, the positioning unit being operatively connected to said guide arrangement,
a motor comprising a moving motor member operatively connected to said linear guide arrangement and an elongated stationary motor member extending parallel to said axis, the moving motor member being adapted to move along the stationary motor member for providing motion parallel to said axis; and
a force transmission arrangement operatively connecting said moving motor member to the positioning unit, wherein the force transmission arrangement is arranged to provide a semi-rigid engagement between said positioning unit and said moving motor member, said semi-rigid engagement being rigid in a direction parallel to said axis for instantaneous transmission of a linear force, and being resilient in directions other than said direction parallel to said axis, whereby transmission to the positioning unit of forces arising from thermal expansion of the motor is reduced or eliminated, wherein the positioning unit and the moving motor member, respectively, are operatively connected to the linear guide arrangement by at least two guide engaging carriages, and wherein the positioning unit is attached to the guide engaging carriages by rigid or resilient positioning unit holders.

20. The dispensing machine according to claim 19, wherein the positioning unit holders are resilient positioning unit holders, and transmission to the positioning unit via said carriages of forces arising from thermal expansion of the motor is reduced or eliminated.

21. The dispensing machine according to claim 19, wherein the positioning unit and the moving motor member share at least two upper and two lower guide engaging carriages, and wherein the moving motor member is fixedly attached to said two upper guide engaging carriages and attached to the lower guide engaging carriages by resilient moving motor holders, or vice versa, and the positioning unit is attached to said two upper and two lower guide engaging carriages by the rigid or resilient positioning unit holders.

* * * * *